United States Patent [19]

Nomoto et al.

[11] 4,420,233

[45] Dec. 13, 1983

[54] PROJECTING APPARATUS

[75] Inventors: Mineo Nomoto; Katsuhiro Iwashita, both of Yokohama; Toru Otsubo, Fujisawa; Susumu Aiuchi, Yokohama, all of Japan

[73] Assignee: Hitachi, Ltd., Tokyo, Japan

[21] Appl. No.: 381,675

[22] Filed: May 24, 1982

[30] Foreign Application Priority Data

May 25, 1981 [JP] Japan ................................. 56-78099

[51] Int. Cl.³ ........................ G03B 27/34; G03B 21/28
[52] U.S. Cl. ..................................... 353/122; 353/99; 353/101; 355/45
[58] Field of Search .................... 353/69, 122, 101, 99; 355/55–57, 43, 65, 66, 73; 354/25 R; 29/829; 156/659.1

[56] References Cited

U.S. PATENT DOCUMENTS

| | | | |
|---|---|---|---|
| 3,103,850 | 9/1963 | Khoury et al. | 355/56 X |
| 3,698,808 | 10/1972 | Delmas | 355/55 X |
| 3,704,657 | 12/1972 | Sliwkowski et al. | 355/56 X |
| 3,718,396 | 2/1973 | Hennings | 355/43 |
| 3,735,686 | 5/1973 | Brewer et al. | 355/56 X |
| 3,748,015 | 7/1973 | Offner | 350/55 |
| 3,832,058 | 8/1974 | Gusovias | 355/56 |
| 3,940,209 | 2/1976 | Portner et al. | 353/99 X |
| 3,984,678 | 10/1976 | Uchiyama et al. | 355/56 X |

*Primary Examiner*—Harry N. Haroian
*Attorney, Agent, or Firm*—Antonelli, Terry & Wands

[57] ABSTRACT

A projecting apparatus for forming an image of a mask on a wafer by a projector of a unit magnification reflection system having a concave spherical mirror and a convex spherical mirror. The distance from the projector to the mask or the upper side of a mask holder for holding the mask and the distance from the projector to the wafer are measured. An error of the image-forming position is computed from the distance measurements. At least one of the mask, the wafer and the projector is moved along the direction of projection in a manner to eliminate the error of the image-forming position computed, thus attaining automatic focus adjustment.

16 Claims, 4 Drawing Figures

PROJECTING APPARATUS

BACKGROUND OF THE INVENTION

The present invention relates to a projecting apparatus having the function of automatic focus adjustment.

As well known, in patterning a wafer providing a substrate of semiconductor integrated circuits by the photoetching technique, a very high resolution is required and therefore a focus adjustment must be effected with high precision.

With the progress of the integrated circuitry technology, on the other hand, the pattern density has been so increased that the depth of focus is required not to exceed ±5 microns in tolerable error. Thus a problem is posed by the focus error of the projecting apparatus caused by the change of atmospheric temperature or the change of material with temperature.

SUMMARY OF THE INVENTION

Accordingly, it is an object of the present invention to provide a projecting apparatus in which the focus adjustment is automatically effected by detecting and eliminating an out-of-focus condition due to a heat effect or the like automatically.

In order to achieve the above-mentioned object, according to the present invention, there is provided a projecting apparatus comprising projector means for projecting an image of a projecting member A such as a mask having a pattern on the surface of an object of projection B such as a wafer, means for measuring the distance from the projector means to the projecting member A and the distance from the projector means to the object of projection B, means for calculating an error of the image-forming position on the basis of the distance measurements, and means for moving at least one of the projecting member A, the object of projection B and the projector means along the direction of projection (optical axis) in order to eliminate the computed error.

DESCRIPTION OF THE PREFERRED EMBODIMENTS

Figure 1:
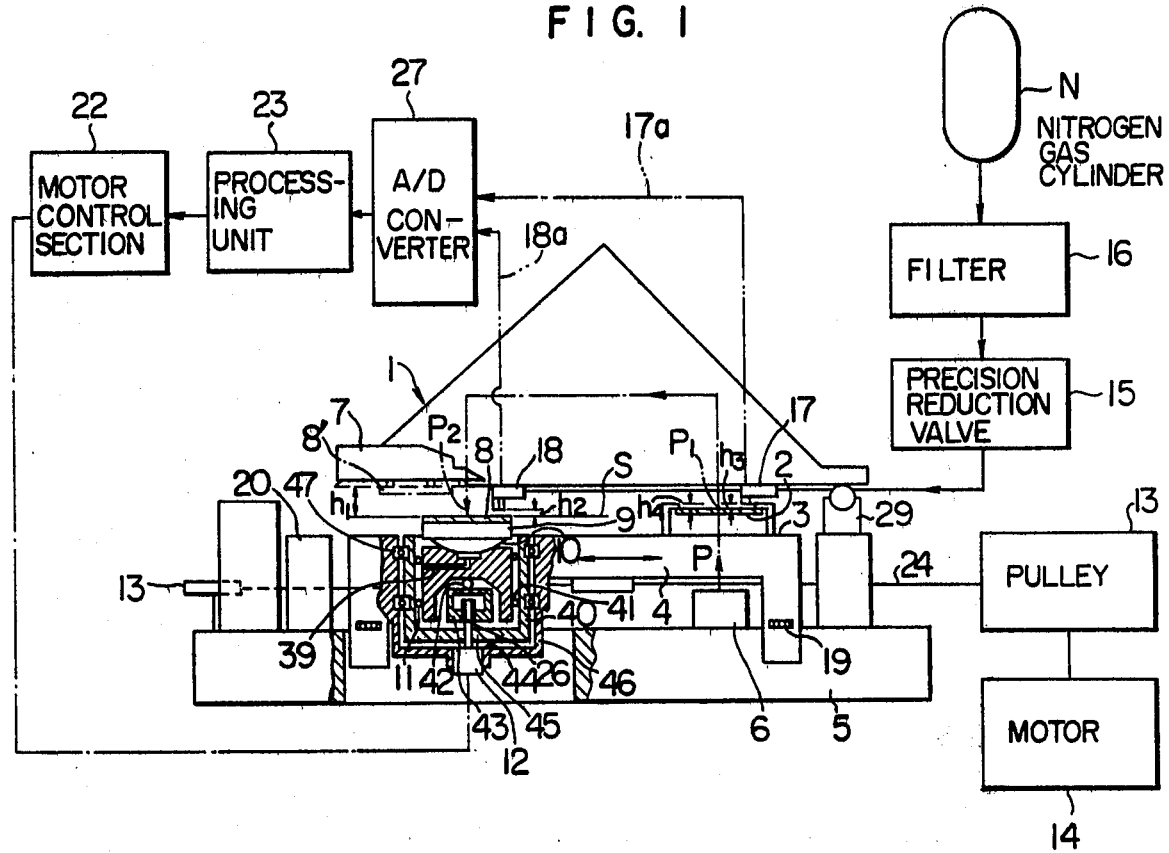
FIG. 1 is a longitudinal sectional view with a circuit diagram of a control system showing an embodiment of the projecting apparatus according to the present invention.
Figure 2:
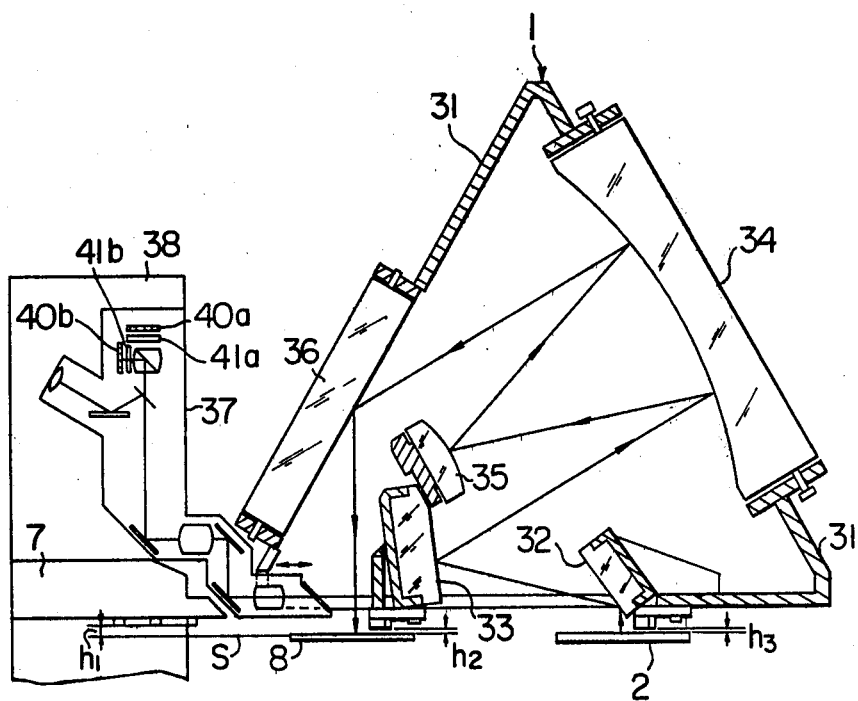
FIG. 2 is a diagram specifically showing an optical system for projection and other parts included in FIG. 1.

An embodiment of the present invention will be described specifically with reference to FIGS. 1 and 2. In FIGS. 1 and 2, reference numeral 1 designates an optical system for projection of a circuit pattern of a mask 2 on a wafer 8 in the ratio of 1 to 1. Specifically, as shown in FIG. 2, the projection optical system 1 includes a triangular frame 31 formed of amber material small in the coefficient of thermal expansion, a planar reflector 32 mounted on the frame 31, a planar reflector 33 mounted on the frame 31, a concave spherical mirror 34 adjustably mounted on the frame 31, a convex spherical mirror 35 mounted on the frame 31, and a planar reflector 36 mounted adjustably on the frame 31, wherein an exposure area in the form of an arcuate band radiated on the mask 2 is projected along the optical axis on the wafer 8 in the ratio of 1 to 1 for the purpose of exposure, i.e., with unit magnification. The ends of the projection optical system 1 are supported in position by a support 29 on a stone stool 5 in order for the frame 31 not to be strained. Numeral 3 designates a mask holder for adsorbing and holding in position the upper surface of the mask 2 formed with a circuit pattern, which mask holder 3 is securely mounted on a carriage 4. Numeral 7 designates a parallel positioning device mounted on the support 38 on the stone stool 5, which parallel positioning device has three pins secured at the lower end thereof in contact with three 120-degree-spaced points along the outer periphery of the wafer 8, so that the lower ends of the pins are positioned in parallel to the image-forming surface S. The carriage 4 is slidably supported on the stone stool 5 by an air pad, and includes a wafer stage 11, vertical drive means 26 for vertically driving the wafer stage 11 and a mask holder 3. The carriage 4 is adapted to be moved in lateral directions in the drawing by a motor 14 through a pulley 13 and a steel belt 24. The wafer stage 11 rotatably supports a wafer chuck 9 for adsorbing and holding the provisionally-positioned wafer 8 by means of a spherical seat 10, and after parallelly positioning the wafer 8 by contacting the parallel positioning device 7, vacuum-adsorbs the wafer 8 from the adsorbing hole 39 thereby to secure the wafer chuck 9. The wafer chuck 11 is vertically movably supported within a $\theta$ table 40 by a bearing 41 provided in a U groove. The central lower end of the wafer chuck 11 engages a nut 43 stopped through a ball 42. The nut 43 is in mesh with a lead screw 26 rotatably supported by a bearing 45 on the bearing 44 at the lower end of the $\theta$ table 40. The lower end of the lead screw 26 is rotatably connected to the output shaft of the motor 12 such as a pulse motor mounted on the X.Y table 46. The $\theta$ table 40 is rotatably supported on the X.Y table 46 by the bearing 47 and is connected to the output of the motor (not shown) on the X.Y table in a manner to effect slow rotation through a reduction gear train. The X.Y table is adapted to inch along X and Y directions on the carriage 4 in order to positionally match the circuit pattern formed on the wafer 8 with the circuit pattern on the mask 2. Numeral 6 designates a light source for radiating a light beam in the form of a circular band. Numeral 20 designates a transport system to pick and place by vacuum adsorption the wafer 8 provisionally positioned on the wafer chuck 9.

The means for measuring the distance $h_2$ from the projection optical system (projector means) to the surface of the object of measurement B (wafer 8) is provided by an air micrometer 18 mounted at the lower end of the frame 31 of the projection optical system 1 in opposed relation to the wafer 8.

The means for measuring the distance from the projection optical system (projector means) to the surface of the projecting member A (the mask 2 carrying a circuit pattern to be exposed), on the other hand, is provided by an air micrometer 17 mounted at the lower end of the frame 31 of the projection optical system 1 in opposed relation to the mask 2. The mask holder 3 attracts the upper side of the mask 2 formed with the circuit pattern and therefore is protruded upward from the upper side of the mask 2. When the carriage 4 is moved, it may be that air micrometer 17 runs into the mask holder 3. It is, however, possible to measure the upper side of the mask holder 3 with the air micrometer 17 and, by adding the thickness $h_4$ of the mask holder measured in advance, to measure the position of the upper side of the mask 2.

The air micrometers 17, 18 are of such a type as to produce measurements as an electrical analog signal.

For computing the focus error on the basis of the measurements of the air micrometers 17 and 18, an A/D converter 27 and a processing unit 23 are provided and connected with lines 17a and 18a so that the measurements of the air micrometers 17 and 18 are applied to the A/D converter 27, and the output of the A/D converter 27 is applied to the processing unit 23. Character N designates a nitrogen gas cylinder for the air micrometers. The nitrogen gas is regulated to predetermined pressure by a precision reduction valve 15 through a filter 16 and supplied to the air micrometers 17 and 18.

Means for automatic adjustment to eliminate the focus error is provided by a motor control section 22 for controlling the motor 12 for the vertical drive means (lead screw) 26. This control unit 22 incorporates a program for driving the motor 12 for the vertical drive means 12 in a direction to reduce the error in response to the electrical signal representing the focus error computed by the processing unit 23.

The air micrometer 18 is, as mentioned in detail later, is of such a construction as to measure the distance of three points along the exposure area of the wafer 8. By way of explanation, however, the operation of the above-mentioned embodiment will be explained on the assumption that the air micrometer 18 is a single air micrometer and the surface of the wafer 8 is free of any roughness. The carriage 4 is disposed on the stone stool 5 and is reciprocally movable laterally in the drawing. This carriage 4 fixedly carries a mask holder 3 for holding the mask 2 having a projection pattern and a vertically movable wafer stage 11 having a spherical seat 10. The wafer chuck 9 having a spherical convex portion adapted to fit the spherical seat 10 is disposed on the wafer stage 11, which in turn has an air hole 39 for communicating with the spherical seat 10. Numeral 26 designates means for vertically driving the wafer stage 11.

A parallel positioning device 7 for providing a reference of positioning the wafer parallel is provided above the wafer chuck 9. Numeral 8' designates a wafer in such a position as to contact the parallel positioning device 7.

The projection optical system 1 including a concave mirror and a convex mirror providing projector means is supported on the support 29 above the carriage 4. Numeral 6 designates a projection light source for radiating light beams in the form of arcuate bands.

The carriage 4 is moved leftward, the wafer 8 is placed on the wafer chuck 9 provisionally, and the vertical drive means 28 is operated thereby to move up the stage 11. The wafer 8 placed provisionally on the wafer chuck 9 is pressed against the parallel positioning device 7 and brought into full contact therewith by the function of the spherical seat 10 while at the same time being placed at position 8' copying the parallel positioning device 7. When air is absorbed by appropriate means from the air hole 39 under this condition, the spherical seat 10 adsorbs the spherical protrusion of the wafer chuck, with the result that the wafer chuck 9 is secured to the wafer stage 11 and adsorbs the wafer at the same time. By operating the vertical drive means 26, the wafer stage 11 is moved downward by the length $h_1$ so that the upper side of the wafer 8 adsorbed to the wafer chuck 9 is aligned with the focal plane S (the image-forming plane for the circuit pattern of the mask 2) of the projection optical system 1.

As described above, the unexposed wafer 8 is set at the focal plane S and held by attraction to the wafer chuck 9, while the carriage 4 is moved horizontally rightward. The carriage 4 is thus moved at a predetermined velocity while being radiated with the exposure light beam P in the form of an arcuate band, so that the point P1 where the exposure light beam P passes through the mask 2 and the point P2 where the exposure light beam P passes through the wafer 8 are scanned at the same rate, thereby exposing the pattern of the mask 2 on the surface of the wafer 8.

As mentioned above, the wafer 8, after being set at the focal plane S, is moved horizontally with precision together with the carriage 4. When the component members making up the projecting apparatus expand or contract by heat caused by the light source 6 or change of the atmospheric temperature, however, the relative positions of the projection optical system 1, the wafer 8 and the mask 2 undergo a change. In the case of the above-mentioned mask aligner, for instance, a change of ambient temperature by 1° C. leads to an error of focal plane by 5 $\mu$m, and even if the temperature is restored afterwards, the original focal plane is not restored exactly due to a hysteresis.

In order to obviate this problem, the wafer chuck 9 is moved down by the length $h_1$, and after setting the wafer 8 at the image-forming plane (focal plane), and the carriage 4 is moved rightward. At the same time, the distance $h_3$ is measured by the air micrometer 17 while the distance $h_2$ is measured by the air micrometer 18. The resulting measurements are applied through the A/D converter 27 to the processing unit 23.

The processing unit 23 charges the distance $h_3$ to a predetermined program, calculates the position of the image-forming plane (focal plane), compares it with $h_2$, computes whether the surface of the wafer 8 is displaced up or down from the image-forming plane S, and applies the result of comparison to the motor control section 22 as an electrical signal. In response to this electrical signal, the motor control section 22 starts the motor 12 in such a direction as to eliminate the error. In the event that the measured distance $h_2$ is larger than the calculated distance to the image-forming plane S, for example, the motor 12 is driven in the direction to move the vertical drive means 26 upward. In this way, even when the relative positions of the projection optical system 1, the mask 2 and the wafer 8 change by heat, the wafer 8 is automatically correctly set to the focal plane S (the plane where image of the circuit pattern of the mask 2 is formed).

In the above-mentioned embodiment, the means for automatic regulation for eliminating the error of the image-forming position includes the motor control section 22 for controlling the motor 12 for moving the wafer 8 providing the object of projection. Instead of moving the wafer 8 providing the object of projection for adjustment of the image-forming position as in this embodiment, the mask 2 carrying the pattern may be moved for adjustment of the image-forming position. Further, the projection optical system 1 making up the projector means may alternatively be moved for adjustment of the image-forming position. Nevertheless, the projection optical system 1 is preferably not moved as it otherwise may develop an error.

Generally, means is provided for reciprocally driving the mask 2 making up a projecting member with a pattern and/or the wafer 8 making up an object of projection along the optical axis of the projector means, and this drive means is operated in such a direction as to eliminate the error of the image-forming position by a device for computing the focus error (the A/D converter 27 and the processing unit 23 in the embodiment under consideration), thus attaining the same effect as in the preceding embodiment.

Figure 3:
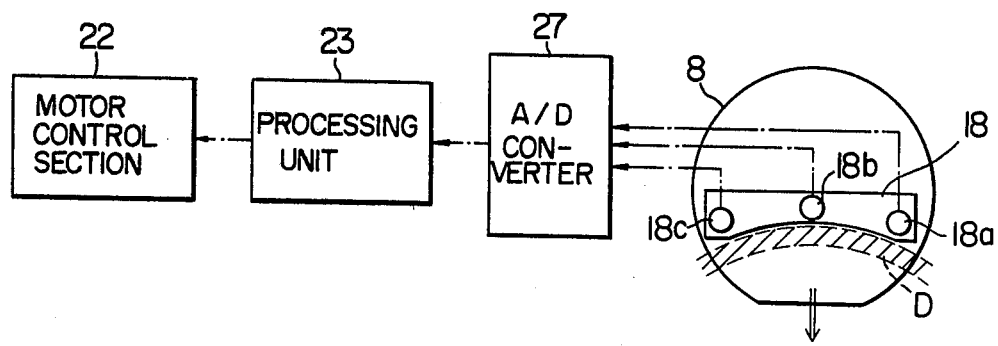
FIG. 3 is an enlarged plan view along with a diagram of the control system showing the parts around an air micrometer shown in FIG. 1.

A detailed plan view of the above-mentioned air micrometer 18 and surrounding members is shown in FIG. 3. The hatched D area represents the exposure area in the form of an arcuate band, in which the wafer 8 passes downward. The air micrometer 18 includes three air micrometers 18a, 18b and 18c which are arranged backward of the wafer 8 along the exposure area D, so that the respective measurements are applied to the A/D converter 27.

Figure 4:
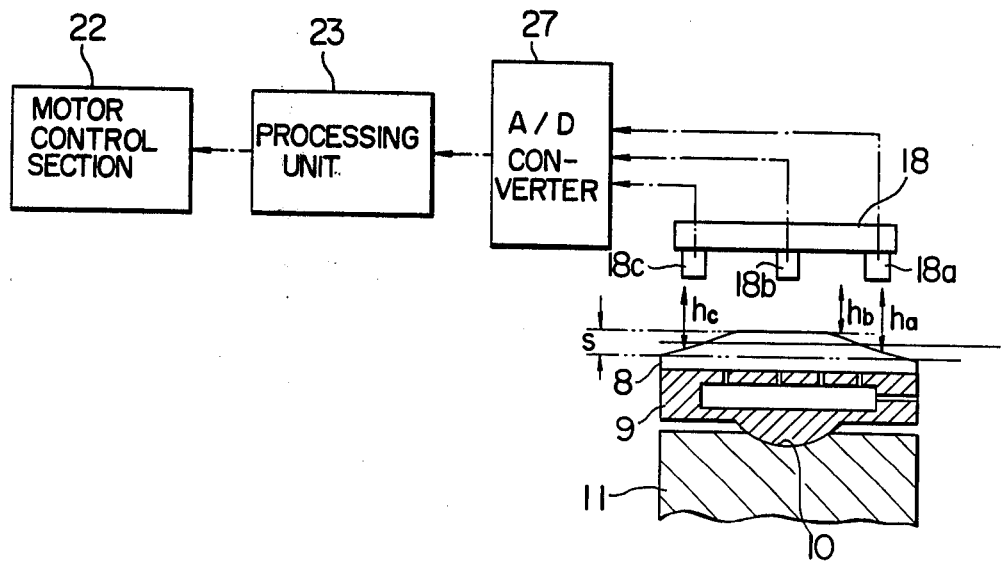
FIG. 4 is a side view similar to FIG. 3 along with a diagram of a control system.

A side view of the members surrounding the devices of FIG. 3 is shown in FIG. 4. The surface of the wafer 8 is surface-ground with precision but has some roughness of the order of microns. The roughness is enlarged for facilitating the understanding in FIG. 4.

The three air micrometers 18a, 18b and 18c detect the distances to the wafer 8 as ha, hb and hc and apply signals representing the results of measurements to the processing unit 23 through the A/D converter 27.

The processing unit 23 picks up the maximum and minimum ones of the three measurements ha, hb and hc and thus determines the positions of the most concave and convex points of the surface of the wafer 8. The processing unit 23 applies a command signal to the motor control section 22 in a manner to distribute the most convex and concave points within the range of tolerable depth s of the focus S. For simplifying this operation by approximation, the position of the wafer 8 is detected with the arithmetical mean of the maximum value (ha in this case) and the minimum value (hb in this case) as the distance to the wafer 8, and the decision as to the direction in which the position of the wafer 8 is displaced with respect to the image-forming plane S (focal plane) is applied in the form of an electrical signal to the motor control section 22. As a result, despite a minute roughness which may exist in the surface of the wafer 8, it is possible to effect a clear projection by containing the entire surface of the wafer 8 within the range s of tolerable depth of the focus S if the difference of the roughness is within the depth of focus.

Numeral 37 designates a microscope for matching the position of the target mark formed on the mask 2 with that of the target mark formed on the wafer 8. The forward end of this microscope is formed for automatic access to the optical axis of the projection optical system 1 as shown by arrow. Numerals 40a and 40b designate linear image sensors for detecting the positions of the target marks along the X and Y axes, and numerals 41a, 41b designate cylindrical lenses for compressing an optical image.

Although the projection optical system 1, the mask 2 and the wafer 8 may be placed in correct relative positions as in the above-mentioned embodiment, it is impossible to compensate for the change of the image-forming position attributable to the change of the optical characteristics caused by the thermal expansion or thermal contraction of the projection optical system 1. In view of the fact that the frame 31 carrying the optical elements 32, 33, 34, 35 and 36 is made of amber material small in the coefficient of thermal expansion, however, the effect of thermal expansion on the frame 31 is less than that on the other movable members such as the carriage 4, the mask holder 3, the X.Y table 46, the $\theta$ table 40, the wafer stage 11, the wafer chuck 9, the lead screw 26 and the support 29, and poses no problem.

In order to compensate for the thermal effect on the projection optical system 1 for more accurate adjustment of the image-forming position, the projection optical system 1 is further provided with a temperature sensor (not shown), and the temperature detection data is applied to the processing unit 23, so that the data as mentioned below is stored in the processing unit in advance. At the same time, an operation program as described below is incorporated in the processing unit 23 for the purpose of the compensation for the thermal effect on the projection optical system 1.

Under the condition where the apparatus is thermally balanced with the ambient temperature of a standard level such as 20° C., a wafer 8 free of roughness in the surface thereof is accurately matched with the focal plane S, so that the distances h2 and h3 are measured and used as $h2_0$ and $h3_0$ respectively.

At each temperature t° C. different from the standard temperature level, the distances h2 and h3 are similarly measured and used as $h2_t$ and $h3_t$ respectively. In this manner, measurements are taken at appropriate intervals of temperature in the range of possible change of ambient temperature, thus determining $h2_t$ and $h3_t$ for each temperature in advance. $\Delta h2_t = h2_t - h2_0$ and $\Delta h3_t = h3_t - h2_t$ for each temperature are computed and stored in the processing unit 23. The values $\Delta h2_t$ and $\Delta h3_t$ represent changes of h2 and h3 due to thermal effect at each temperature of t.

In response to the distance signals of h2 and h3 measured by the air micrometers 18 and 17, the processing unit 23 adds the values $\Delta h2_t$ and $\Delta h3_t$ for the prevailing temperature t° C. to the values h2 and h3 respectively on the basis of the temperature signal obtained from a temperature sensor (not shown) which is applied to the processing unit 23 at the same time as the distance signals, thus making comparison with the focal plane S. In this way, the error of the image-forming position due to the change of ambient temperature is corrected automatically.

The aforementioned embodiment includes a mask aligner of projection type having the magnification of 1:1. This invention is applicable with equal effect also to a mask aligner of reduced projection type or enlarged projection type. Further, a projection apparatus using an electron beam or ion beam instead of a light beam is covered by the present invention with equal effect.

It will be understood from the foregoing description that according to the present invention, there is provided a projection apparatus for forming an image of a projecting member A with a pattern on an object of projection B, comprising means for measuring the distance from projector means to the projecting member A and the distance from the projector means to the object of projection B, means for computing the error of the image-forming position on the basis of the distance measurements, and means for moving along the direction of projection (along the optical axis) at least one of the projecting member A, the object of projection B and the projector means in a manner to eliminate the error computed. In this way, the error of focus attributable to the thermal effect or secular variation is automatically detected, thereby automatically adjusting the image-forming position without such as error.

We claim:

1. A projecting apparatus comprising:
   (a) projector means for forming an image of a projecting member with a pattern on an object of projection, said projector means including a unit magnification reflection optical system having a concave spherical mirror and a convex spherical mirror for projecting the image along an optical axis thereof;
   (b) means for measuring a selected one of the distance from said projector means to said projecting member and the distance from said projector means to a holder means for holding said projecting member, said measuring means also measuring the distance from said projector means to said object of projection;
   (c) means for computing the error of an image-forming position on the basis of the distance measurements taken by said measuring means; and
   (d) moving means for moving along the direction of the optical axis of said projector means at least one of said projecting member, said object of projection and said projector means so as to eliminate the error of the image-forming position computed by said computing means and thereby attain an automatic focus adjustment.

2. A projecting apparatus according to claim 1, wherein said projector means includes a frame carrying said reflection optical system, said measuring means being mounted on the frame.

3. A projecting apparatus according to claim 2, further comprising carriage means slidably supported for movement on a stone stool in at least one direction perpendicular to the direction of movement of said moving means, and a holder means for holding said object of projection, said holder means for holding the projecting member and said holder means for holding said object of projection being mounted on said carriage means.

4. A projecting apparatus according to claim 3, further comprising parallel positioning means for positioning the projection surface of said projecting member in parallel to the image-forming surface of said projector means, said moving means being constructed to drive said projecting member-holding means in the direction of the optical axis of said projector means with respect to said carriage means.

5. A projecting apparatus according to claim 2, wherein said means for measuring the distance from said object of projection to said projector means includes at least three sensors arranged along an exposure area in the form of an arcuate band formed on said object of projection.

6. A projecting apparatus according to claim 5, wherein said sensors are air micrometers.

7. A projecting apparatus according to claim 2, wherein said means for measuring the distance from said projecting means to said projector member measures the distance from the upper side of said holder means for holding said projecting member to said projector means.

8. A projecting apparatus according to claim 1, wherein said projecting member with a pattern is a mask with a circuit pattern thereon, and said object of projection is a wafer arranged for having the image of the circuit pattern projected thereon.

9. A projecting apparatus comprising:
   projector means for forming an image of a projecting member having a pattern on an object of projection, said projector means including a unit magnification image-forming system having a concave spherical mirror and a convex spherical mirror for projecting the image along an optical axis thereof;
   carriage means for mounting a first holding means for holding said projecting member and a second holding means for holding said object of projection, said carriage means being slidably supported on a stool for movement at least unidirectionally along a direction perpendicular to the direction of the optical axis of said projector means;
   measuring means for measuring a selected one of the distance from said projector means to said projecting member and the distance from said projector means to said first holding means, said measuring means also measuring the distance from said projector means to said object of projection;
   computing means for computing the error of an image-forming position on the basis of the distance measurements of said measuring means; and
   moving means for moving the object of projection held by said second holding means with respect to said carriage means along the direction of the optical axis of said projector means so as to eliminate the error of the image-forming position computed by said computing means and thereby attain an automatic focus adjustment.

10. A projecting apparatus according to claim 9, further comprising a frame mounting said unit magnification image-forming system, said measuring means being mounted on said frame.

11. A projecting apparatus according to claim 9, wherein said second holding means comprises parallel positioning means for positioning the projection surface of said object of projection in parallel to the image-forming surface formed by said projector means.

12. A projecting apparatus according to claim 11, wherein said measuring means for measuring the distance from said object of projection to said projector means includes at least three sensors arranged along an exposure area in the form of an arcuate band formed on said object of projection.

13. A projecting apparatus according to claim 12, wherein said sensors comprise air micrometers.

14. A projecting apparatus according to claim 11, wherein said second holding means is provided with a table arranged for rotation and incrementally movable in orthogonal directions, microscope means for detecting target marks formed by said projecting member and said object of projection, and means for moving said table to effect alignment in accordance with the detected aberrations of the target marks.

15. A projecting apparatus according to claim 12, wherein said second holding means is provided with a table arranged for rotation and incrementally movable in orthogonal directions, microscope means for detecting target marks formed by said projecting member and said object of projection, and means for moving said table to effect alignment in accordance with the detected aberrations of the target marks.

16. A projecting apparatus according to claim 9, wherein said projecting member having a pattern is a mask with a circuit pattern thereon, and said object of projection is a wafer arranged for having the image of said circuit pattern projected thereon.

* * * * *